(12) United States Patent
Barot et al.

(10) Patent No.: US 12,710,454 B2
(45) Date of Patent: Aug. 18, 2026

(54) OPTO-EMULATOR

(71) Applicant: TEXAS INSTRUMENTS INCORPORATED, Dallas, TX (US)

(72) Inventors: Kashyap Barot, Bengaluru (IN); Arvind Gupta, New Delhi (IN); Avinash Shah, Jharsuguda (IN); Sreeram Nasum S, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 251 days.

(21) Appl. No.: 18/524,737

(22) Filed: Nov. 30, 2023

(65) Prior Publication Data

US 2025/0076348 A1 Mar. 6, 2025

(30) Foreign Application Priority Data

Aug. 31, 2023 (IN) ............................ 202341058609

(51) Int. Cl.
*G01R 19/00* (2006.01)

(52) U.S. Cl.
CPC ................................ *G01R 19/0038* (2013.01)

(58) Field of Classification Search
CPC ..... G01R 19/0038; H04B 3/30; H04B 1/0475
See application file for complete search history.

(56) References Cited

U.S. PATENT DOCUMENTS

2007/0070653 A1 3/2007 Sutardja
2017/0201399 A1* 7/2017 Adinarayana ........ H04B 1/0475
2024/0195409 A1* 6/2024 Shah .................. H03K 17/6871
2024/0195417 A1* 6/2024 Shah ................ H03K 19/00384
2025/0219436 A1* 7/2025 Mizutani .................. H02J 7/02

* cited by examiner

*Primary Examiner* — Christopher E Mahoney
(74) *Attorney, Agent, or Firm* — Xianghui Huang; Frank D. Cimino

(57) ABSTRACT

An opto-emulator transmitter includes: a current controller; an oscillator circuit; and receiver replica circuitry. The current controller has a first terminal, a second terminal, and a third terminal. The oscillator circuit has a first terminal, a second terminal, and a third terminal. The first terminal of the oscillator circuit is coupled to the second terminal of the current controller. The receiver replica circuitry has a first terminal, a second terminal, and a third terminal. The first terminal of the receiver replica circuitry is coupled to the second terminal of the oscillator circuit. The second terminal of the receiver replica circuitry is coupled to the third terminal of the oscillator circuit. The third terminal of the receiver replica circuitry is coupled to the third terminal of the current controller.

20 Claims, 6 Drawing Sheets

OPTO-EMULATOR

CROSS REFERENCE TO RELATED APPLICATION

The present application claims priority to India Provisional Application No. 202341058609, titled "ARCHITECTURE FOR ANALOG OPTO EMULATION", filed on Aug. 31, 2023, which is hereby incorporated by reference in its entirety.

BACKGROUND

Opto-couplers are isolation devices that include light-emitting and light-sensitive components to transmit signals while blocking ground potential differences (GPDs) between the them. The light-emitting component is typically a light-emitting diode (LED), and the light-sensitive component is usually a phototransistor or photodiode. The light-emitting component and the light-sensitive components are physically separated by distance and an insulating material. With opto-couplers, an output current ($I_C$) is proportional to an input current ($I_F$). Over time, signal transmission through opto-couplers is degraded due to aging of the light-emitting component, clouding of the insulating material, and/or other aging issues. Also, a ratio $I_C/I_F$ may vary over time.

Opto-emulators are intended to provide the same isolated communications behavior as opto-couplers with the benefits of improved speed, isolation, operational temperature range, and aging characteristics. However, opto-emulators still suffer from some issues including non-linearity of the ratio $I_C/I_F$.

SUMMARY

In an example, an opto-emulator transmitter includes: a current controller; an oscillator circuit; and receiver replica circuitry. The current controller has a first terminal, a second terminal, and a third terminal. The oscillator circuit has a first terminal, a second terminal, and a third terminal. The first terminal of the oscillator circuit is coupled to the second terminal of the current controller. The receiver replica circuitry has a first terminal, a second terminal, and a third terminal. The first terminal of the receiver replica circuitry is coupled to the second terminal of the oscillator circuit. The second terminal of the receiver replica circuitry is coupled to the third terminal of the oscillator circuit. The third terminal of the receiver replica circuitry is coupled to the third terminal of the current controller.

In another example, an opto-emulator transmitter includes: transmitter circuitry having a first terminal, a second terminal, a third terminal, a fourth terminal, and a fifth terminal; and receiver replica circuitry having a first terminal, a second terminal, and a third terminal. The first terminal of the receiver replica circuitry is coupled to the third terminal of the transmitter circuitry. The second terminal of the receiver replica circuitry is coupled to the fourth terminal of the transmitter circuitry. The third terminal of the receiver replica circuitry is coupled to the fifth terminal of the transmitter circuitry. The transmitter circuitry is configured to: receive a current at the first terminal of the transmitter circuitry; provide a transmit signal at the third and fourth terminals of the transmitter circuitry responsive to the current; receive a feedback signal from the receiver replica circuitry at the fifth terminal of the transmitter circuitry, the feedback signal responsive to the transmit signal; and provide an adjusted transmit signal at the third and fourth terminals of the transmitter circuitry responsive to the current and the feedback signal.

In yet another example, an opto-emulator circuit includes a receiver die; and a transmitter die. The receiver die includes: a first rectifier circuit having a first terminal, a second terminal, and a third terminal; and a first transistor having a first terminal, a second terminal, and a control terminal, the control terminal of the transistor coupled to the third terminal of the rectifier circuit. The transmitter die includes: a current controller; an oscillator circuit, a second rectifier circuit, and a second transistor. The current controller has a first terminal, a second terminal, and a third terminal. The oscillator circuit has a first terminal, a second terminal, and third terminal. The first terminal of the oscillator circuit is coupled to the second terminal of the current controller. The second rectifier circuit has a first terminal, a second terminal, and a third terminal. The first terminal of the second rectifier circuit is coupled to the second terminal of the oscillator circuit. The second terminal of the second rectifier circuit is coupled to the third terminal of the oscillator circuit. The second transistor has a first terminal, a second terminal, and a control terminal. The control terminal of the transistor is coupled to the third terminal of the second rectifier circuit.

DETAILED DESCRIPTION

Figure 1:
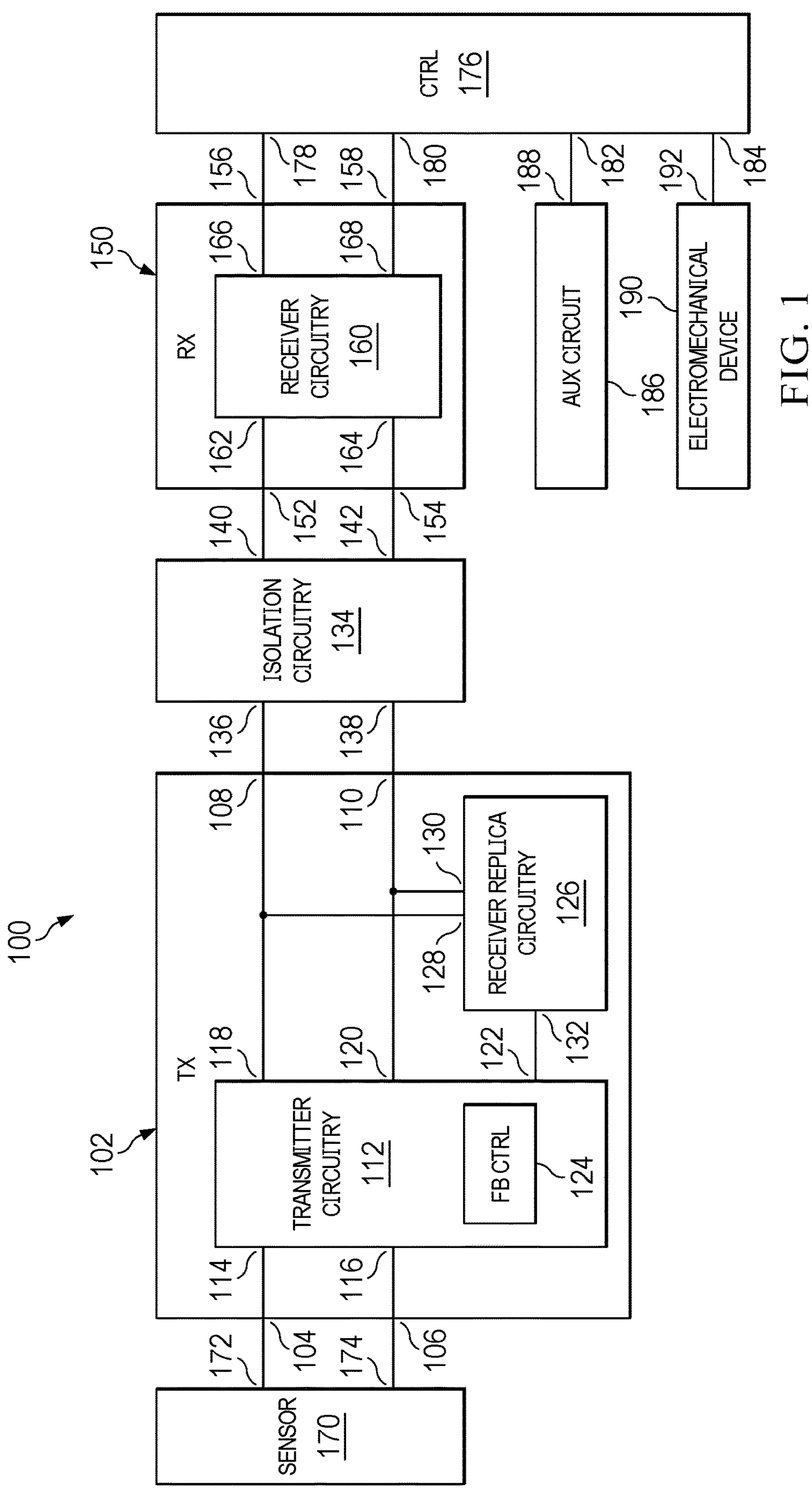
FIG. 1 is a block diagram showing an example system.

The same reference numbers or other reference designators are used in the drawings to designate the same or similar features. Such features may be the same or similar either by function and/or structure.

Described herein are analog opto-emulator topologies. As used herein, an "opto-emulator" refers to a circuit that includes the same input terminals and output terminals of an opto-coupler and emulates opto-coupler behavior (providing an output current ($I_C$) proportional to input current ($I_F$)) without a light-emitting component and without a light-receiving component. The described analog opto-emulator topologies provide benefits, relative to opto-couplers and some other opto-emulators, including: improved linearity of the current transfer ratio (CTR, where $CTR=I_C/I_F$) over a wide range of $I_C$ and $I_F$ values; and improved immunity and isolation ratings.

FIG. 1 is a block diagram showing an example system 100. As shown, the system 100 includes a sensor 170, an opto-emulator transmitter 102, isolation circuitry 134, an opto-emulator receiver 150, a controller 176, an auxiliary circuit 186, and an electromechanical device 190. The sensor 170 has a first terminal 172 and a second terminal 174. The opto-emulator transmitter 102 has a first terminal 104, a second terminal 106, a third terminal 108, and a fourth terminal 110. The isolation circuitry 134 has a first terminal 136, a second terminal 138, a third terminal 140, and a fourth terminal 142. The opto-emulator receiver 150 has a first terminal 152, a second terminal 154, a third terminal 156, and a fourth terminal 158. The controller 176 has a first terminal 178, a second terminal 180, a third terminal 182, and a fourth terminal 184. The auxiliary circuitry 186 has a terminal 188. The electromechanical device 190 has a terminal 192.

In the example of FIG. 1, the opto-emulator transmitter 102 includes transmitter circuitry 112 and receiver replica circuitry 126. The transmitter circuitry 112 has a first terminal 114, a second terminal 116, a third terminal 118, a fourth terminal 120, and a fifth terminal 122. As shown, the transmitter circuitry 112 include feedback control circuitry 124. The receiver replica circuitry 126 has a first terminal 128, a second terminal 130, and a third terminal 132. The opto-emulator transmitter 102 includes receiver circuitry 160. The receiver circuitry 160 has a first terminal 162, a second terminal 164, a third terminal 166, and a fourth terminal 168.

The first terminal 104 of the opto-emulator transmitter 102 is coupled to the first terminal 172 of the sensor 170. The second terminal 106 of the opto-emulator transmitter 102 is coupled to the second terminal 174 of the sensor 170. The third terminal 108 of the opto-emulator transmitter 102 is coupled to the first terminal 136 of the isolation circuitry 134. The fourth terminal 110 of the opto-emulator transmitter 102 is coupled to the second terminal 138 of the isolation circuitry 134. The third terminal 140 of the isolation circuitry 134 is coupled to the first terminal 152 of the opto-emulator receiver 150. The fourth terminal of the isolation circuitry 134 is coupled to the second terminal 154 of the opto-emulator receiver 150. The third terminal 156 of the opto-emulator receiver 150 is coupled to the first terminal 178 of the controller 176. The fourth terminal 158 of the opto-emulator receiver 150 is coupled to the second terminal 180 of the controller 176. The third terminal 182 of the controller 176 is coupled to the terminal 188 of the auxiliary circuit 186. The fourth terminal 184 of the controller 176 is coupled to the terminal 192 of the electromechanical device 190.

The first terminal 114 of the transmitter circuitry 112 is coupled to the first terminal 104 of the opto-emulator transmitter 102. The second terminal 116 of the transmitter circuitry 112 is coupled to the second terminal 106 of the opto-emulator transmitter 102. The third terminal 118 of the transmitter circuitry 112 is coupled to the third terminal 108 of the opto-emulator transmitter 102 and to the first terminal 128 of the receiver replica circuitry 126. The fourth terminal 120 of the transmitter circuitry 112 is coupled to the fourth terminal 110 of the opto-emulator transmitter 102 and to the second terminal 130 of the receiver replica circuitry 126. The third terminal 132 of the receiver replica circuitry 126 is coupled to the fifth terminal 122 of the transmitter circuitry 112. The The first terminal 162 of the receiver circuitry 160 is coupled to the first terminal 152 of the opto-emulator receiver 150. The second terminal 164 of the receiver circuitry 160 is coupled to the second terminal 154 of the opto-emulator receiver 150. The third terminal 166 of the receiver circuitry 160 is coupled to the third terminal 156 of the opto-emulator receiver 150. The fourth terminal 168 of the receiver circuitry 160 is coupled to the fourth terminal 158 of the opto-emulator receiver 150.

In some examples, the sensor 170 operates to sense an ambient parameter (e.g., a voltage, a current, a temperature, a magnetic field, motion, vibration, etc.) and provide a current or current modulation at the first terminal 172 responsive to the sensed ambient parameter. The opto-emulator transmitter 102 operates to: receive the current or current modulation at the first terminal 104; prepare a transmit signal responsive to the received current or current modulation, operations of the transmitter circuitry 112, and operations of the receiver replica circuitry 126; and provide the transmit signal to the third terminal 108 and/or the fourth terminal 110. During operations of the opto-emulator transmitter 102 current may flow from the first terminal 104 through the transmitter circuitry 112 and/or through the receiver replica circuitry 126 to the second terminal 106. The second terminal 106 may be coupled to ground or a ground terminal (not shown).

In some examples, the transmitter circuitry 112 operates to: receive the current or current modulation at the first terminal 114; provide a transmit signal at the third terminal 118 and the fourth terminal 120 responsive to the received current or current modulation and the operations of the transmitter circuitry 112. The receiver replica circuitry 126 operates to: receive the transmit signal at the first terminal 128 and the second terminal 130; and provide a feedback signal at the third terminal 132 responsive to the transmit signal and the operations of the receiver replica circuitry 126. Over time, the transmitter circuitry 112 also operates to: receive the feedback signal at the fifth terminal 122; and adjust the transmit signal based on the feedback signal and the operations of the feedback control circuitry 124. In some examples, opto-emulator transmitter 102 receives an input current between 0.5 mA to 5 mA and provides a transmit signal with a differential input swing between 0.7V to 1.4V.

In some examples, the isolation circuitry 134 operates to: receive the transmit signal at the first terminal 136 and the second terminal 138; and provide an isolated transmit signal at the third terminal 140 and the fourth terminal 142. In some examples, the isolation circuitry 134 includes a transformer. As another example, the isolation circuitry 134 may include capacitive isolation circuitry. In some examples, the isolated transmit signal is attenuated relative to the transmit signal. Also, the isolated transmit signal may remove a common-mode signal or other features of the transmit signal. In some examples, the transmitter circuitry 112 receives a transmit signal with a differential input swing between 0.7V to 1.4V and provides an isolated transmit signal with a differential switch between 0.5V to 1.05V.

In some examples, the opto-emulator receiver 150 operates to: receive the isolated transmit signal at the first terminal 152 and the second terminal 154; and provide an opto-emulator result at the third terminal 156 and the fourth terminal 158 based on the isolated transmit signal and operations of the receiver circuitry 160. In some examples, the opto-emulator receiver 150 receives an isolated transmit signal with a differential input swing between 0.7V to 1.4V and provides an output current that is proportional to the input current. Without limitation, the output current may be 130%, 180%, 300% or 440% greater than the input current. In such examples, the respective CTR is 1.3, 1.8, 3.0, or 4.4.

The controller 176 operates to: receive the opto-emulator result at the first terminal 178 and the second terminal 180; process the opto-emulator result as part of feedback-based control operations; provide a first control signal at the third terminal 182 responsive to the feedback-based control operations; and provide a second control signal at the fourth terminal 184 responsive to the feedback-based control operations. The auxiliary circuit 186 operates to: receive the first control signal at the terminal 188; and adjust an auxiliary operation responsive to the first control signal. In some examples, the auxiliary circuit 186 is a display controller, and the auxiliary operation adjusts information to be displayed using the display controller. The electromechanical device 190 operates to: receive the second control signal at the terminal 192; and adjust operations of the electromechanical device 190 responsive to the second control signal. In some examples, the electromechanical device 190 is a motor and the second control signal adjusts the speed and/or torque of the motor. In another example, the electromechanical device 190 is an actuator and the second control signal adjusts the position of the actuator.

Figure 2:
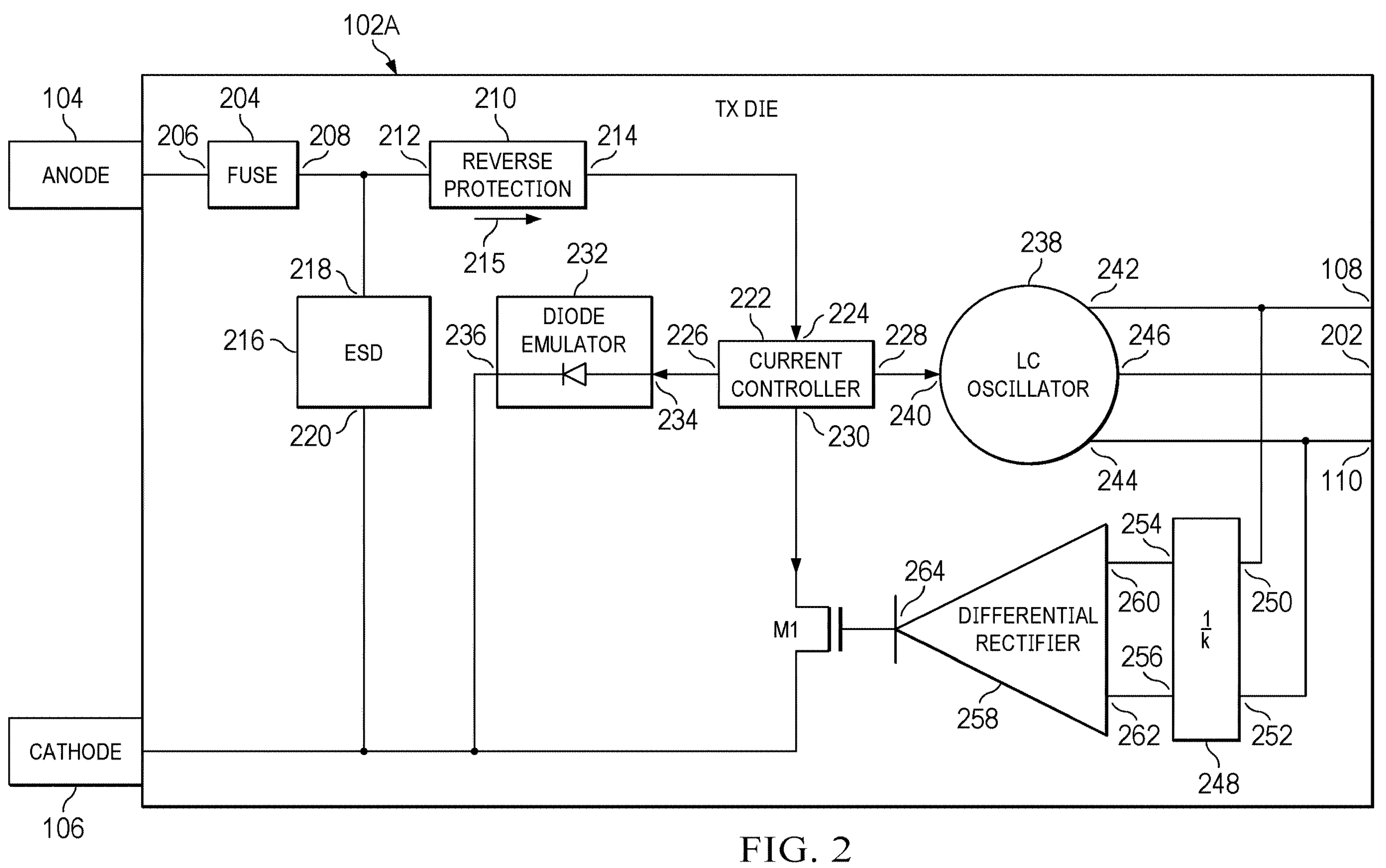
FIG. 2 is a diagram showing an example opto-emulator transmitter.

FIG. 2 is a diagram showing an example opto-emulator transmitter 102A. The opto-emulator transmitter 102A is an example of the opto-emulator transmitter 102 of FIG. 1. The opto-emulator transmitter 102A includes the first terminal 104, the second terminal 106, the third terminal 108, and the fourth terminal 110 described in FIG. 1. Using opto-coupler terminology, the first terminal 104 may be referred to as an anode terminal, and the second terminal 106 may be referred to as a cathode terminal. The opto-emulator transmitter 102A also has a fifth terminal 202.

In the example of FIG. 2, the opto-emulator transmitter 102A includes a fuse 204, reverse protection circuitry 210, electrostatic discharge (ESD) circuitry 216, a current controller 222, a diode emulator 232, an inductor-capacitor (LC) oscillator 238, an attenuator circuit 248, a differential rectifier circuit 258, and a transistor M1 in the arrangement shown. Comparing FIG. 2 to FIG. 1, the fuse 204, the reverse protection circuitry 210, the ESD circuitry 216, the current controller 222, the diode emulator 232, and the LC oscillator 238 are example components of the transmitter circuitry 112 in FIG. 1. The current controller 222 and the diode emulator 232 are example components of the feedback control circuitry 124. The differential rectifier circuit 258 and the transistor M1 are example components of the receiver replica circuitry 126.

As shown, the fuse 204 has a first terminal 206 and a second terminal 208. The reverse protection circuitry 210 has a first terminal 212 and a second terminal 214. The ESD circuitry 216 has a first terminal 218 and a second terminal 220. The current controller 222 has a first terminal 224, a second terminal 226, a third terminal 228, and a fourth terminal 230. The diode emulator 232 has a first terminal 234 and a second terminal 236. The LC oscillator 238 has a first terminal 240, a second terminal 242, a third terminal 244, and a fourth terminal 246. The attenuator circuit 248 has a first terminal 250, a second terminal 252, a third terminal 254, and a fourth terminal 256. The differential rectifier circuit 258 has a first terminal 260, a second terminal 262, and a third terminal 264. The transistor M1 has a first terminal, a second terminal, and a control terminal.

The first terminal 206 of the fuse 204 is coupled to the first terminal 104 of the opto-emulator transmitter 102A. The second terminal 208 of the fuse 204 is coupled to the first terminal 212 of the reverse protection circuitry 210 and to the first terminal 218 of the ESD circuitry 216. The second terminal of the ESD circuitry 216 is coupled to the second terminal 106 of the opto-emulator transmitter 102A. The second terminal 214 of the reverse protection circuitry 210 is coupled to the first terminal 224 of the current controller 222. The second terminal 226 of the current controller 222 is coupled to the first terminal 234 of the diode emulator 232. The second terminal 236 of the diode emulator 232 is coupled to the second terminal 106 of the opto-emulator transmitter 102A. The third terminal 228 of the current controller 222 is coupled to the first terminal 240 of the LC oscillator 238. The fourth terminal 230 of the current controller is coupled to the first terminal of the transistor M1. The second terminal 242 of the LC oscillator 238 is coupled to the third terminal 108 of the opto-emulator transmitter 102A and to the first terminal 250 of the attenuator circuit 248. The third terminal 244 of the LC oscillator 238 is coupled to the fourth terminal 110 of the opto-emulator transmitter 102A and to the second terminal 252 of the attenuator circuit 148. The fourth terminal 246 of the LC oscillator 238 is coupled to the fifth terminal 202 of the opto-emulator transmitter 102A. The third terminal 254 of the attenuator circuit 248 is coupled to the first terminal 260 of the differential rectifier circuit 258. The fourth terminal 256 of the attenuator circuit 248 is coupled to the second terminal 262 of the differential rectifier circuit 258. The third terminal 264 of the differential rectifier circuit 258 is coupled to the control terminal of the transistor M1. The second terminal of the transistor M1 is coupled to the second terminal 106 of the opto-emulator transmitter 102A.

In some examples, the opto-emulator transmitter 102A operates to: receive a current or current modulation at the first terminal 104 (e.g., from a sensor such as the sensor 170 in FIG. 1); prepare a transmit signal responsive to the received current or current modulation, operations of transmitter circuitry (e.g., the fuse 204, the reverse protection circuitry 210, the ESD circuitry 216, the current controller 222, the diode emulator 232, and the LC oscillator 238), and operations of the receiver replica circuitry (e.g., the differential rectifier circuit 258 and the transistor M1); and provide the transmit signal to the third terminal 108 and/or the fourth terminal 110. During operations of the opto-emulator transmitter 102A current may flow from the first terminal 104 through transmitter circuitry and/or through the receiver replica circuitry 126 to the second terminal 106. The second terminal 106 may be coupled to ground or a ground terminal (not shown).

In some examples, the fuse 204 operates to: receive current at the first terminal 206; if the received current is less than a threshold, convey the current to the second terminal 208; and, if the received current is equal to or greater than the threshold, create an open circuit. The reverse protection circuitry 210 operates to: receive current at the first terminal 212; convey the received current to the second terminal 214, responsive to the current having a forward direction 215; and prevent current flows in an opposite (reverse) direction relative to the forward direction 215. The ESD circuitry 216 operates to: receive ESD voltage and/or ESD current at the first terminal 218; maintain ESD voltage below a threshold; and discharge ESD current to ground (e.g., by selectively connecting the first terminal 218 to the second terminal 220 when the ESD current exceeds a threshold.

The current controller 222 operates to: receive a regulated (e.g., clamped) current at the first terminal 224; provide a first current to diode emulator 232 responsive to the regulated current; generate an input voltage (VF) between the first terminal 104 and the second terminal 106 of the opto-emulator transmitter 102A, where VF is based on the input current (IF); provide a second current to the LC oscillator 238 responsive to the regulated current; provide a third current to the transistor M1 responsive to the regulated current; compare the third current with a scaled down version of the second current to obtain comparison results; and adjust the second current responsive to the comparison results. In some examples, the current controller 222 includes the reliability clamp circuitry (e.g., the reliability clamp circuitry 502 in FIG. 5), shunt bypass circuitry (e.g., the shunt bypass circuitry 504 in FIG. 5), source follower circuitry (e.g., the source follower circuitry 506 in FIG. 5), current mirror circuitry (e.g., the current mirror circuitry 508 in FIG. 5), and/or the current comparator circuitry (e.g., the current comparator circuitry 510 in FIG. 5).

The diode emulator 232 operates to: generate VF between the first terminal 104 and the second terminal 106 responsive to the input current. In some examples, the diode emulator 232 includes VF bias circuitry (e.g., the VF bias circuitry 512 in FIG. 5).

The LC oscillator 238 operates to: receive VF, or a voltage based on VF (e.g., proportional to VF), at the first terminal 240; receive the second current from the current controller 222 at the first terminal 240; and provide a transmit signal at the second terminal 242 and the third terminal 244 responsive to the received voltage and current. In some examples, the transmit signal is a differential signal relative to the fourth terminal 246, which may be coupled to ground or a ground terminal. The attenuator circuit 248 operates to: receive the transmit signal at the first terminal 250 and the second terminal 252; and provide an attenuated transmit signal at the third terminal 254 and the fourth terminal 256. The differential rectifier circuit 258 operates to receive the attenuated transmit signal at the first terminal 260 and the second terminal 262; and provide a rectified signal at the third terminal 264 responsive to the attenuated transmit signal. The transistor M1 operates to: receive the rectified signal at the control terminal of the transistor M1; and selectively enable current flow from the first terminal to the second terminal of the transistor M1 responsive to the rectified signal.

Figure 3:
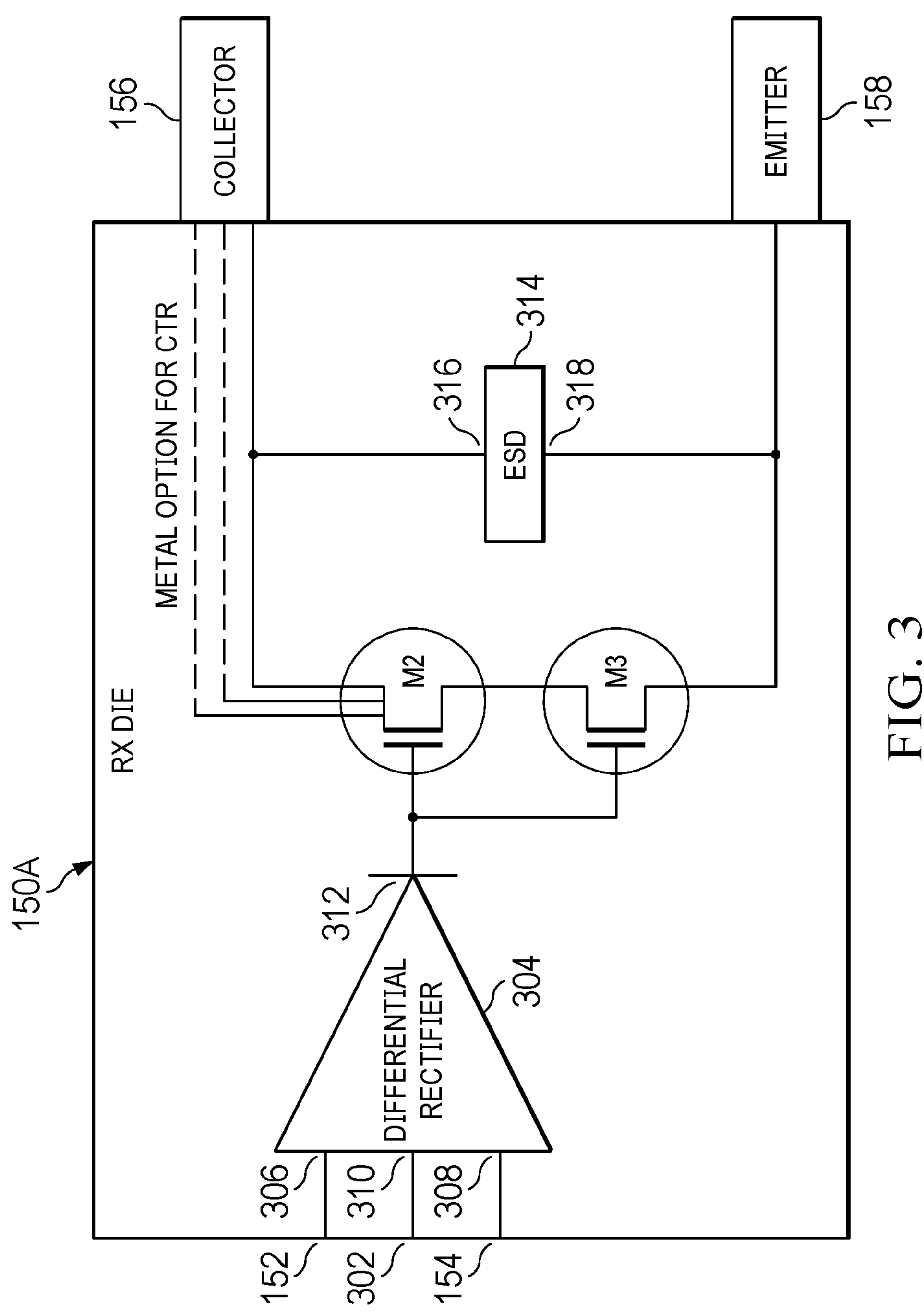
FIG. 3 is a diagram showing an example opto-emulator receiver.

FIG. 3 is a diagram showing an example opto-emulator receiver 150A. The opto-emulator receiver 150A is an example of the opto-emulator receiver 150 in FIG. 1. The opto-emulator receiver 150A has the first terminal 152, the second terminal 154, the third terminal 156, and the fourth terminal 158 described in FIG. 1. Using opto-coupler terminology, the third terminal 156 may be referred to as a collector terminal, and the fourth terminal 158 may be referred to as an emitter terminal. The opto-emulator receiver 150A also has a fifth terminal 302.

In the example of FIG. 3, the opto-emulator receiver 150A includes a differential rectifier circuit 304, transistors M2 and M3, and ESD circuitry 314 in the arrangement shown. Comparing FIG. 3 to FIG. 1, the differential rectifier circuit 304 and the transistor M2 are example components of the receiver circuitry 160 in FIG. 1. The differential rectifier circuit 304 has a first terminal 306, a second terminal 308, a third terminal 310, and a fourth terminal 312. Each of the transistors M2 and M3 has a respective first terminal, a respective second terminal, and a respective control terminal. The ESD circuitry 314 has a first terminal and a second terminal.

The first terminal 306 of the differential rectifier circuit 304 is coupled to the first terminal 152 of the opto-emulator receiver 150A. The second terminal 308 of the differential rectifier circuit 304 is coupled to the second terminal 154 of the opto-emulator receiver 150A. The third terminal 310 of the differential rectifier circuit 304 is coupled to the fifth terminal 302 of the opto-emulator receiver 150A. The fourth terminal of the differential rectifier circuit 304 is coupled to the control terminals of the transistors M2 and M3. The first terminal of the transistor M2 is coupled to the third terminal 156 of the opto-emulator receiver 150A and to the first terminal 316 of the ESD circuitry 314. The second terminal of the transistor M2 is coupled to the first terminal of the transistor M3. The second terminal of the transistor M3 is coupled to the fourth terminal 158 of the opto-emulator receiver 150A and to the second terminal 18 of the ESD circuitry 314. In some examples, the transistor M2 can be duplicated with parallel copies having respective first terminals selectively coupled together and/or having respective control terminals selectively coupled together to provide adjustable CTR values as a fabrication option or post-fabrication control option.

In the example of FIG. 3, the transistor M2 serves as the current controlling transistor in the forward direction (current flowing from the third terminal 156 to the fourth terminal 158). The transistor M3 serves as an ON switch in the forward direction (current flowing from the third terminal 156 to the fourth terminal 158) and as an OFF switch in the reverse direction (blocking current flow from the fourth terminal 158 to the third terminal 156). In some examples, the transistor M1 is a replica of the transistor M2, and a replica of the transistor M3 is not used.

In some examples, the opto-emulator receiver 150 operates to: receive the isolated transmit signal at the first terminal 152 and the second terminal 154; and provide an opto-emulator result at the third terminal 156 and the fourth terminal 158 based on the isolated transmit signal and operations of receiver circuitry (e.g., the differential rectifier circuit 304 and the transistor M2). In some examples, the isolated transmit signal is a differential signal, where the isolated transmit signal is received at the first terminal 152 and the second terminal 154 relative to the fifth terminal 302, which may be coupled ground or a ground terminal (not shown).

The differential rectifier circuit 304 operates to: receive the isolated transmit signal at the first terminal 306 and the second terminal 308 relative to the third terminal 310, which may be coupled to ground or a ground terminal (not shown); and provide a rectified signal at the fourth terminal 312 responsive to the isolated transmit signal. The transistor M2 operates to: receive the rectified signal at its control terminal; and enable current flow between its first and second terminals responsive to the rectified signal. The transistor M3 operates to: receive the rectified signal at its control terminal; and enable current flow between its first and second terminals responsive to the rectified signal. The ESD circuitry 314 operates to: receive ESD voltage and/or ESD current at the first terminal 316; maintain ESD voltage below a threshold; and discharge ESD current to ground (e.g., by selectively connecting the first terminal 316 to the second terminal 318 when the ESD current exceeds a threshold. With the opto-emulator receiver 150A, an isolated transmit signal is converted to a modulated current at the third terminal 156 and the fourth terminal 158. When the output of the differential rectifier circuit 304 is low, the opto-emulator results (i.e., the output current) is low. When the output of the differential rectifier circuit 304 is high, the opto-emulator results (i.e., the output current) is high. In other words, the output current from the opto-emulator receiver 150A is proportional to the input current into the opto-emulator transmitter.

Figure 4:
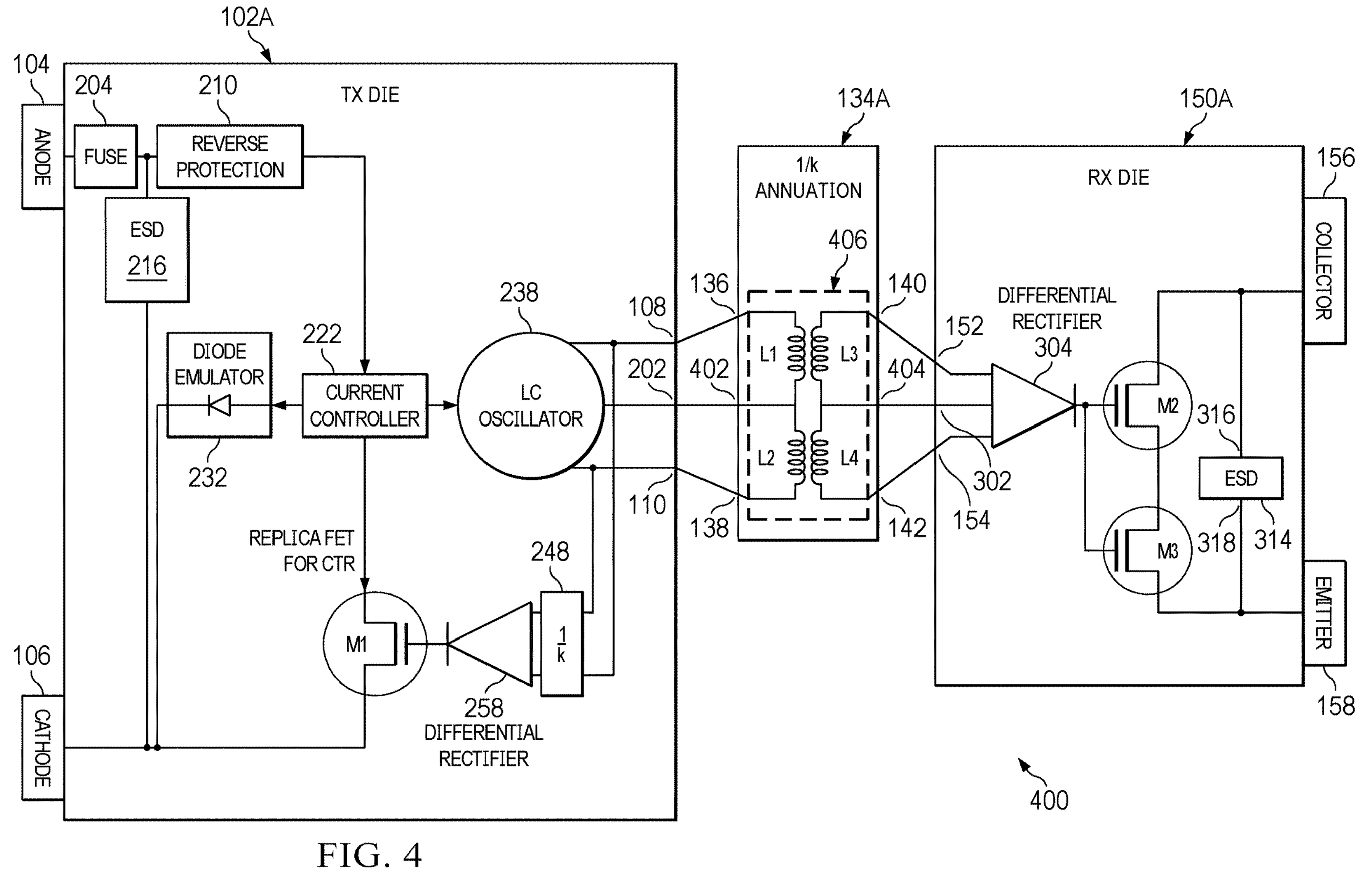
FIG. 4 is a diagram showing an example opto-emulator.

FIG. 4 is a diagram showing an example opto-emulator 400. In the example of FIG. 4, the opto-emulator 400 includes the opto-emulator transmitter 102A of FIG. 2, isolation circuitry 134A, and the opto-emulator receiver 150A of FIG. 3. The isolation circuitry 134A is an example of the isolation circuitry 134 in FIG. 1. In the example of FIG. 4, the opto-emulator transmitter 102A has the same terminals and components as in FIG. 2, and the opto-emulator receiver 150A has the same terminals and components as in FIG. 3. The isolation circuitry 134A has the first terminal 136, the second terminal 138, the third terminal 140, and the fourth terminal 142 described in FIG. 1. The isolation circuitry 134A also has a fifth terminal 402 and a sixth terminal 404.

In the example of FIG. 4, the opto-emulator transmitter 102A, the isolation circuitry 134A, and the opto-emulator receiver 150A are separate integrated circuit (IC) dies. In some examples, the separate IC dies may be packaged together as a multi-chip module (MCM).

In the example of FIG. 4, the isolation circuitry 134A includes transformer circuitry 406. The transformer circuitry 406 is an example of one transformer with center taps on both the input side and the output side. As shown, the transformer circuitry 406 includes a first coil L1, a second coil L2, a third coil L3, and a fourth coil L4. The first coil L1 has a first terminal and a second terminal. The second coil L2 has a first terminal and a second terminal. The third coil L3 has a first terminal and second terminal. The fourth terminal L4 has a first terminal and a second terminal. The first terminal of the first coil L1 is coupled to the first terminal 136 of the isolation circuitry 134A. The second terminal of the first coil L1 is coupled to the fifth terminal 402 of the isolation circuitry 134A and to the first terminal of the second coil L2. The second terminal of the second coil L2 is coupled to the second terminal 138 of the isolation circuitry 134A. The first terminal of the third coil L3 is coupled to the third terminal 140 of the isolation circuitry 134A. The second terminal of the third coil L3 is coupled to the sixth terminal 404 of the isolation circuitry 134A and to the first terminal of the fourth coil L4. The second terminal of the fourth coil L4 is coupled to the fourth terminal 142 of the isolation circuitry 134A.

In the example of FIG. 4, the opto-emulator transmitter 102A performs the operations described in FIG. 2, the isolation circuitry 134A performs the operations described for the isolation circuitry 134 in FIG. 1, and the opto-emulator receiver 150A performs the operations described in FIG. 3. With the isolation circuitry 134A, the transmit signal received at the first terminal 136 and the second terminal 138 is relative to the fifth terminal 402, which may be coupled to ground or a ground terminal (not shown). Also, the isolated transmit signal provided at the third terminal 140 and the fourth terminal 142 is relative to the sixth terminal 404, which may be coupled to ground or a ground terminal (not shown). In other examples, the isolation circuitry 134A may include capacitive isolation circuitry instead of the transformer circuitry 406.

Figure 5:
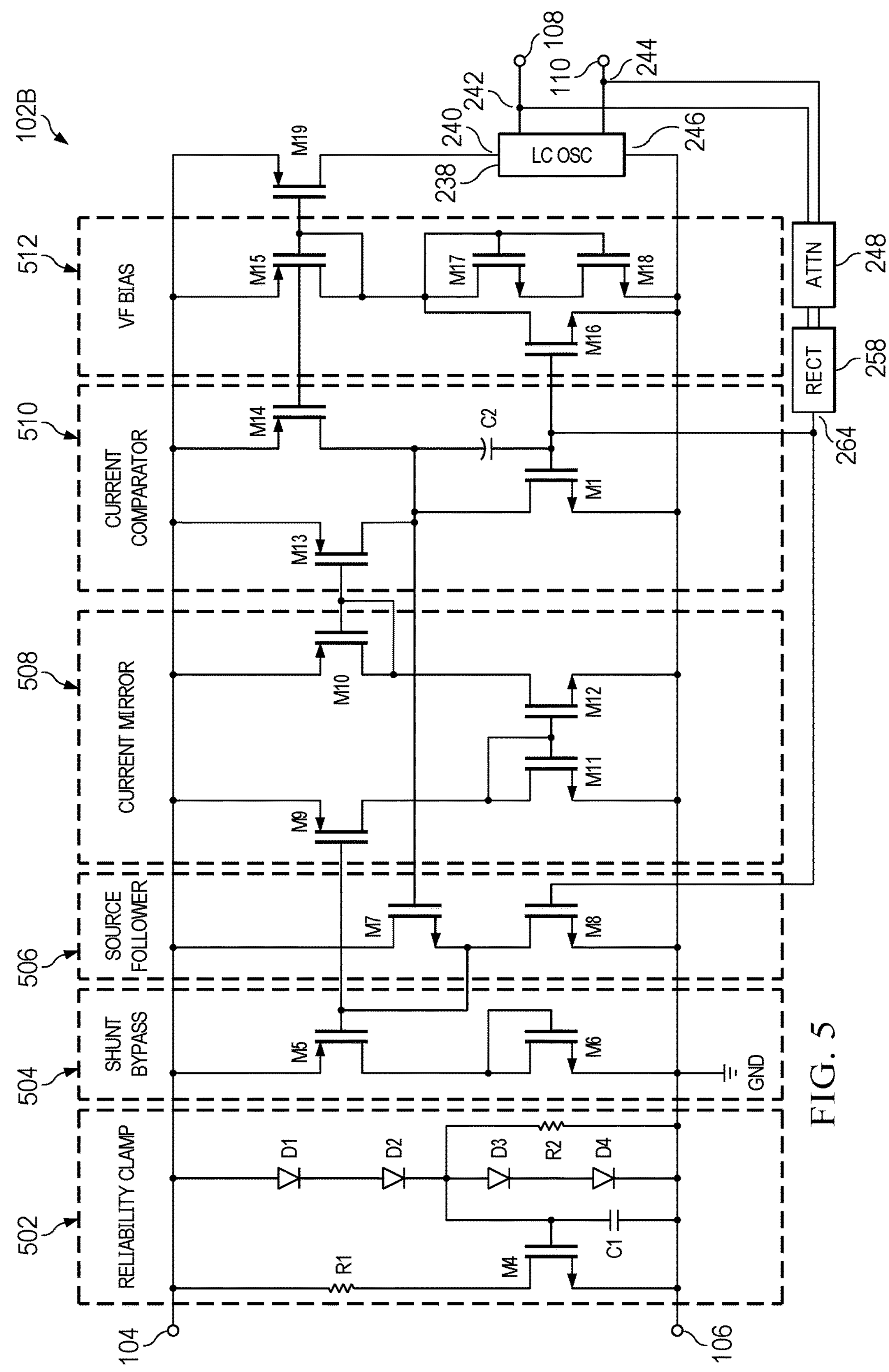
FIG. 5 is a diagram showing another example opto-emulator transmitter.

FIG. 5 is a diagram showing an example opto-emulator transmitter 102B. The opto-emulator transmitter 102B is an example of the opto-emulator transmitter 102B. The opto-emulator transmitter 102B is an example of the opto-emulator transmitter 102 in FIG. 1, or the opto-emulator transmitter 102A in FIG. 2. As shown, opto-emulator transmitter 102B has the first terminal 104, the second terminal 106, the third terminal 108, and the fourth terminal 110 described in FIGS. 1 and 2.

In the example of FIG. 5, the opto-emulator transmitter 102B includes reliability clamp circuitry 502, shunt bypass circuitry 504, source follower circuitry 506, current mirror circuitry 508, current comparator circuitry 510, VF bias circuitry 512, a transistor M19, the LC oscillator 238, the attenuator circuit 248, and the differential rectifier circuit 258. Comparing the opto-emulator transmitter 102B to the opto-emulator transmitter 102A of FIG. 2, the reliability clamp circuitry 502, the shunt bypass circuitry 504, the source follower circuitry 506, the current mirror circuitry 508, the current comparator circuitry 510, and the VF bias circuitry 512 are example components of the current controller 222 and the diode emulator 232 of FIG. 2.

As shown, the reliability clamp circuitry 502 includes resistors R1 and R2, a transistor M4, diodes D1 to D4, and a capacitor C1 in the arrangement shown. The shunt bypass circuitry 504 includes transistors M5 and M6 in the arrangement shown. The source follower circuitry 506 includes transistor M7 and M8 in the arrangement shown. The current mirror circuitry 508 includes transistor M9 to M12 in the arrangement shown. The current comparator circuitry 510 includes the transistor M1, transistors M13 and M14, and a capacitor C2 is the arrangement shown. The VF bias circuitry 512 includes transistors M15 to M8 in the arrangement shown. In the example of FIG. 5, each of the resistors R1 and R2 has a respective first terminal and a respective second terminal. Each of the capacitors C1 and C2 has a respective first terminal and a respective second terminal. Each of the diodes D1 to D4 has a respective first terminal and a respective second terminal. Each of the transistors M4 to M19 has a respective first terminal, a respective second terminal, and a respective control terminal.

Regarding the reliability clamp circuitry 502, the first terminal of the resistor R1 and the first terminal of the diode D1 are coupled to the first terminal 104 of the opto-emulator transmitter 102B. The second terminal of the resistor R1 is coupled to the first terminal of the transistor M4. The second terminal of the transistor M4 is coupled to the second terminal 106 of the opto-emulator transmitter 102B. The second terminal of the diode D1 is coupled to the first terminal of the diode D2. The second terminal of the diode D2 is coupled to the control terminal of the transistor M4, the first terminal of the capacitor C1, the first terminal of the diode D3, and the first terminal of the resistor R2. The second terminal of the capacitor C1 is coupled to the second terminal 106 of the opto-emulator transmitter 102B. The second terminal of the diode D3 is coupled to the first terminal of the diode D4. The second terminal of the diode D4 is coupled to the second terminal 106 of the opto-emulator transmitter 102B. The second terminal of the resistor R2 is coupled to the second terminal 106 of the opto-emulator transmitter 102B.

Regarding the shunt bypass circuitry 504, the first terminal of the transistor M5 is coupled to the first terminal 104 of the opto-emulator transmitter 102B. The second terminal of the transistor M5 is coupled to the first terminal of the transistor M6 and the control terminal of the transistor M6. The second terminal of the transistor M6 is coupled to the second terminal 106 of the opto-emulator transmitter 102B.

Regarding the source follower circuitry 506, the first terminal of the transistor M7 is coupled to the first terminal 104 of the opto-emulator transmitter 102B. The second terminal of the transistor M7 is coupled to the first terminal of the transistor M8 and to the control terminal of the transistor M5. The second terminal of the transistor M8 is coupled to the second terminal 106 of the opto-emulator transmitter 102B. The control terminal of the transistor M8 is coupled to the third terminal 264 of the differential rectifier circuit 258.

Regarding the current mirror circuitry 508, the first terminals of the transistors M9 and M10 are coupled to first terminal 104 of the opto-emulator transmitter 102B. The second terminal of the transistor M9 is coupled to the first terminal of the transistor M11 and to the control terminals of the transistors M11 and M12. The control terminal of the transistor M9 is coupled to the control terminal of the transistor M5. The second terminal of the transistor M11 is coupled to the second terminal 106 of the opto-emulator transmitter 102B. The second terminal and the control terminal of the transistor M10 is coupled to the first terminal of the transistor M12. The second terminal of the transistor M12 is coupled to the second terminal 106 of the opto-emulator transmitter 102B.

Regarding the current comparator circuitry 510, the first terminals of the transistors M13 and M14 are coupled to the first terminal 104 of the opto-emulator transmitter 102B. The second terminal of the transistor M13 is coupled to the first terminal of the transistor M1, the control terminal of the transistor M7, the second terminal of the transistor M14, and the first terminal of the capacitor C2. The control terminal of the transistor M13 is coupled to the control terminal of the transistor M10. The second terminal of the transistor M1 is coupled to the second terminal 106 of the opto-emulator transmitter 102B. The second terminal of the capacitor C2 and the control terminal of the transistor M1 are coupled to the third terminal 264 of the differential rectifier circuit 258.

Regarding the VF bias circuitry 512, the first terminal of the transistor M15 is coupled to the first terminal 104 of the opto-emulator transmitter 102B. The second terminal and the control terminal of the transistor M15 are coupled to the first terminals of the transistors M16 and M17 and to the control terminals of the transistors M17 and M18. The control terminal of the transistor M16 is coupled to the third terminal 264 of the differential rectifier circuit 258. The second terminal of the transistor M17 is coupled to the first terminal of the transistor M18. The second terminals of the transistors M16 and M18 are coupled to second terminal 106 of the opto-emulator transmitter 102B.

The first terminal of the transistor M19 is coupled to first terminal 104 of the opto-emulator transmitter 102B. The second terminal of the transistor M19 is coupled to the first terminal 240 of the LC oscillator 238. The control terminal of the transistor M19 is coupled to the control terminal of the transistor M15. The second terminal 242 of the LC oscillator 238 is coupled to the third terminal 108 of the opto-emulator transmitter 102B. The third terminal 244 of the LC oscillator 238 is coupled to the fourth terminal 110 of the opto-emulator transmitter 102B. The fourth terminal 246 of the LC oscillator is coupled to the second terminal 106 of the opto-emulator transmitter 102B. In the example of FIG. 5, the second terminal of the opto-emulator transmitter 102B is coupled to ground or a ground terminal. The attenuator circuit 248 is coupled to the third terminal 108 and the fourth terminal of the opto-emulator transmitter 102B as described in FIG. 2. The differential rectifier circuit 258 is coupled to the attenuator circuit 248 as described in FIG. 2.

The reliability clamp circuitry 502 operates to: receive an input current or current modulation; and clamp the voltage at the first terminal 104 of the opto-emulator transmitter 102B to below a target voltage (e.g., 2V) depending on the current level. The clamping function is based on the forward voltages of the diodes D1 to D4 and sets a voltage level and a current regulation based on resistor R1, the transistor M4, the capacitor C1, and the resistor R2. The shunt bypass circuitry 504 operates to: clamp and bypass extra input current; and limit current to the LC oscillator 238. The source follower circuitry 506 operates to set the gain of the current controller 222. In some examples, the gain is set to 1. The current mirror circuitry 508 operates to: mirror the current of the shut bypass circuitry 504; attenuate the mirrored current by a target factor (e.g., 20); and provide the mirrored current to the current comparator circuitry 510. The current comparator circuitry 510 operates to: compare input current attenuated by the target factor (the summation of attenuated shunt bypass current through the transistor M13 and the attenuated oscillator current through the transistor M14) with the current through the transistor M1 (the output current attenuated by the target factor). Based on the comparison, the current in the shunt bypass circuitry 504 and the LC oscillator 238 are adjusted such that the total input current (the current through the transistor M13+the current through the transistor M14) becomes equal to scaled output current through the transistor M1 in steady state. The VF bias circuitry 512 operates to: generate VF between the first terminal 104 and the second terminal 106 responsive to the input current.

In the example of FIG. 5, the opto-emulator transmitter 102B uses the attenuator circuit 248 to replicate the attenuation by isolation circuitry (e.g., the isolation circuitry 134 in FIG. 1 or the isolation circuitry 134A in FIG. 4) and uses the differential rectifier circuit 258 to replicate the differential rectifier (e.g., the differential rectifier circuit 304 in FIG. 3) of an opto-emulator receiver (e.g., the opto-emulator receiver 150A in FIG. 3). The results from the attenuator circuit 248 and the differential rectifier circuit 258 are used as a feedback signal to adjust the current to the LC oscillator 238 using the reliability clamp circuitry 502, the shunt bypass circuitry 504, the source follower circuitry 506, the current mirror circuitry 508, the current comparator circuitry 510, and the VF bias circuitry 512. By adjusting the current to the LC oscillator 238 based on the feedback signal from the attenuator circuit 248 and the differential rectifier circuit 258, CTR linearity of an opto-emulator (e.g., the opto-emulator 400 in FIG. 4) is improved.

Figure 6:
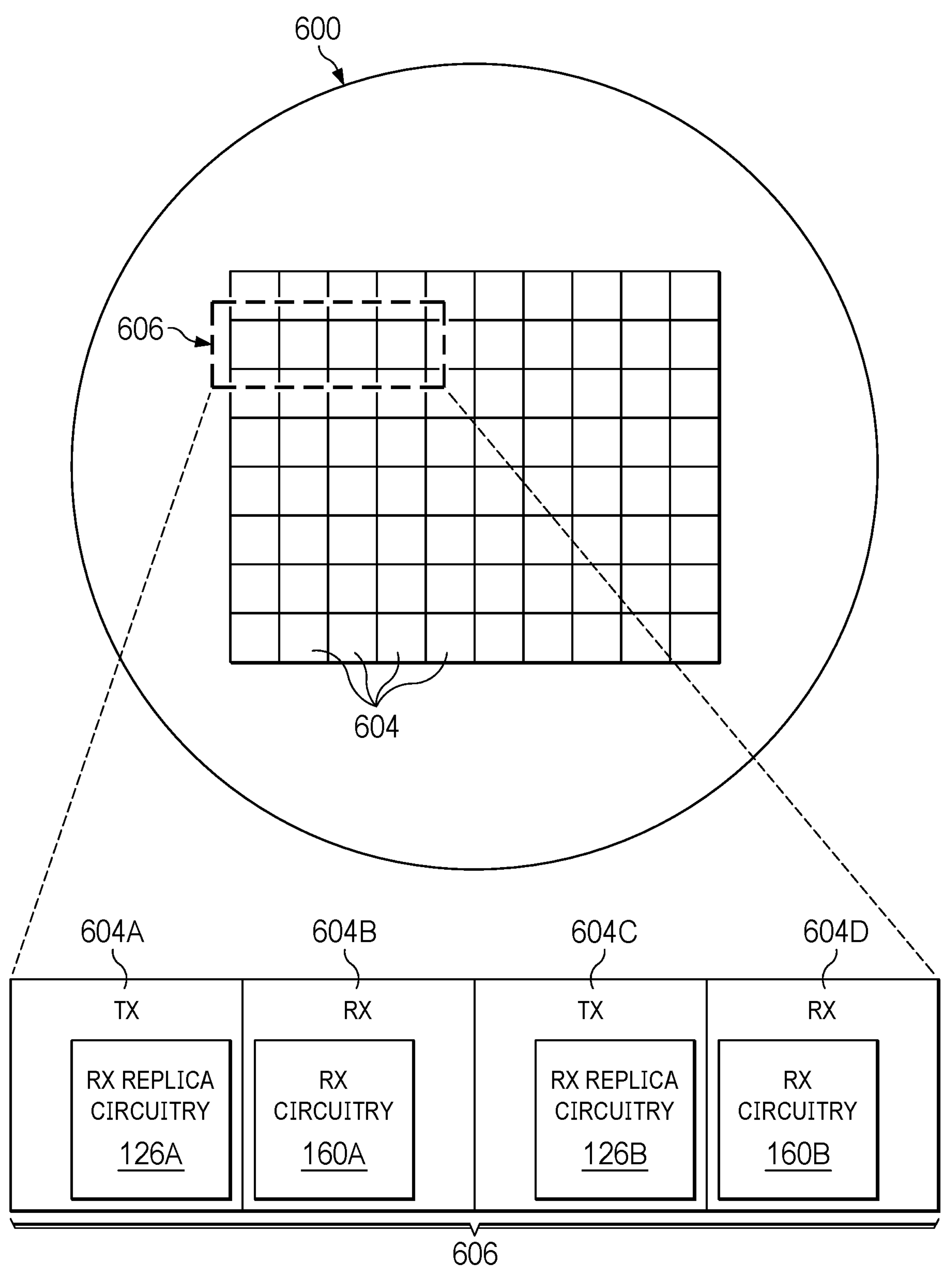
FIG. 6 is a diagram showing an example wafer for opto-emulators.

FIG. 6 is a diagram showing an example wafer 600 for opto-emulators. The wafer 600 includes a plurality of dies 604 including die area 606. The die area 606 includes part of a row of dies including a first die 604A, a second die 604B, a third die 604C, and a fourth die 604D. The first die 604A is an opto-emulator transmitter die with receiver replica circuitry 126A. The second die 604B is an opto-emulator receiver die with receiver circuitry 160A. The third die 604C is an opto-emulator transmitter die with receiver replica circuitry 126B. The fourth die 604D is an opto-emulator receiver die with receiver circuitry 160B. The receiver replica circuitry 126A and 126B are examples of the receiver replica circuitry 126 in FIG. 1. The receiver circuitry 160A and 160B are examples of the receiver circuitry 160 in FIG. 1.

In some examples, the receiver replica circuitry 126A of the first die 604A is fabricated adjacent to the receiver circuitry 160A of the second die 604B. Similarly, the receiver replica circuitry 126B of the third die 604C is fabricated adjacent to the receiver circuitry 160B of the fourth die 604D. In the example of FIG. 4, the receiver replica circuitry 126A is fabricated on the right side of the first die 604A, and the receiver circuitry 160A is fabricated on the left side of the second die 604B. Also, the receiver replica circuitry 126B is fabricated on the right side of the third die 604C, and the receiver circuitry 160B is fabricated on the left side of the fourth die 604D. By fabricating receiver replica circuitry of an opto-emulator transmitter near related receiver circuitry of an opto-emulator receiver on the wafer 600, process variation is reduced. Reducing process variation of receiver replica circuitry of an opto-emulator transmitter and related receiver circuitry of an opto-emulator receiver, reduces mismatch and improves CTR linearity. In other examples, the position of receiver replica circuitry (e.g., the receiver replica circuitry 126A) and related receiver circuitry (e.g., the receiver circuitry 160A) on a die may vary (e.g., a top/bottom option, a bottom/top option, a left/right option, a right/left option, etc.).

In some examples, an opto-emulator transmitter (e.g., the opto-emulator transmitter 102A in FIG. 2) includes a current controller (e.g., the current controller 222 in FIG. 2, or related circuitry in FIG. 5) having a first terminal (e.g., the first terminal 224 in FIG. 2), a second terminal, (e.g., the third terminal 228 in FIG. 2) and a third terminal (e.g., the fourth terminal 230 in FIG. 2). The opto-emulator transmitter also includes an oscillator circuit (e.g., the LC oscillator 238 in FIG. 2) having a first terminal (e.g., the first terminal 240 in FIG. 2), a second terminal (e.g., the second terminal 242 in FIG. 2), and a third terminal (e.g., the third terminal 244 in FIG. 2). The first terminal of the oscillator circuit is coupled to the second terminal of the current controller. The opto-emulator transmitter also includes receiver replica circuitry (e.g., the receiver replica circuitry 126 in FIG. 1) having a first terminal (e.g., the first terminal 128 in FIG. 1), a second terminal (e.g., the second terminal 130 in FIG. 1), and a third terminal (e.g., the third terminal 132 in FIG. 1). The first terminal of the receiver replica circuitry is coupled to the second terminal of the oscillator circuit. The second terminal of the receiver replica circuitry is coupled to the third terminal of the oscillator circuit. The third terminal of the receiver replica circuitry is coupled to the third terminal of the current controller.

In some examples, the receiver replica circuitry includes a transistor (e.g., the transistor M1 herein) having a first terminal, a second terminal, and a control terminal. The first terminal of the transistor is coupled to the third terminal of the receiver replica circuitry. In some examples, the receiver replica circuitry includes a rectifier circuit (e.g., the differential rectifier circuit 258 in FIG. 2) having a first terminal (e.g., the first terminal 260 in FIG. 2), a second terminal (e.g., the second terminal 262 in FIG. 2), and a third terminal (e.g., the third terminal 264 in FIG. 2). The first terminal of the rectifier circuit is coupled to the first terminal of the receiver replica circuitry. The second terminal of the rectifier circuit is coupled to the second terminal of the receiver replica circuitry. The third terminal of the rectifier circuit is coupled to the third terminal of the receiver replica circuitry. The third terminal of the receiver replica circuitry is coupled to the control terminal of the transistor. In some examples, the rectifier circuit is a differential rectifier circuit, and the oscillator circuit is a differential oscillator circuit.

In some examples, the opto-emulator transmitter also includes an attenuator circuit (e.g., the attenuator circuit 248 in FIG. 2) having a first terminal (e.g., the first terminal 250 in FIG. 2), a second terminal (e.g., the second terminal 252 in FIG. 2), a third terminal (e.g., the third terminal 254 in FIG. 2), and a fourth terminal (e.g., the fourth terminal 256 in FIG. 2). The first terminal of the attenuator circuit is coupled to the second terminal of the oscillator circuit. The second terminal of the attenuator circuit is coupled to the third terminal of the oscillator circuit. The third terminal of the attenuator circuit is coupled to the first terminal of the receiver replica circuitry. The fourth terminal of the attenuator circuit is coupled to the second terminal of the receiver replica circuitry.

In some examples, the opto-emulator transmitter includes a fuse (e.g., the fuse 204 in FIG. 2), reverse protection circuitry (e.g., the reverse protection circuitry 210 in FIG. 2), and ESD circuitry (e.g., the ESD circuitry in FIG. 2). The fuse has a first terminal (e.g., the first terminal 206 in FIG. 2) and a second terminal (e.g., the second terminal 208 in FIG. 2). The reverse protection circuitry has a first terminal (e.g., the first terminal 212 in FIG. 2) and a second terminal (e.g., the second terminal 214 in FIG. 2). The ESD circuitry has a first terminal (e.g., the first terminal 218 in FIG. 2) and a second terminal (e.g., the second terminal 220 in FIG. 2). The second terminal of the fuse is coupled to the first terminal of the reverse protection circuitry and to the first terminal of the ESD circuitry. The second terminal of the reverse protection circuitry is coupled to the first terminal of the current controller.

In some examples, the current controller 222 includes the reliability clamp circuitry (e.g., the reliability clamp circuitry 502 in FIG. 5), shunt bypass circuitry (e.g., the shunt bypass circuitry 504 in FIG. 5), source follower circuitry (e.g., the source follower circuitry 506 in FIG. 5), current mirror circuitry (e.g., the current mirror circuitry 508 in FIG. 5), and/or the current comparator circuitry (e.g., the current comparator circuitry 510 in FIG. 5). In some examples, the current controller has a fourth terminal (e.g., the second terminal 226 in FIG. 2), and the opto-emulator transmitter includes a diode emulator (e.g., the diode emulator 232 in FIG. 2) having a first terminal (e.g., the first terminal 234 in FIG. 2) and a second terminal (e.g., the second terminal 236 in FIG. 2). The first terminal of the diode emulator is coupled to the fourth terminal of the current controller. In some examples, the diode emulator includes VF bias circuitry (e.g., the VF bias circuitry 512 in FIG. 5).

In some examples, the current controller includes reliability clamp circuitry and shunt bypass circuitry. The reliability clamp circuitry is configured to clamp voltage and current levels of the opto-emulator transmitter. The shunt bypass circuitry is configured to regulate an output current to the oscillator circuit. In some examples, the current controller includes source follower circuitry, current mirror circuitry, and current comparator circuitry. The source follower circuitry is configured to set a gain level of the current controller. The current mirror circuitry is configured to mirror current of the shunt bypass circuitry to the current comparator circuitry. The current comparator circuitry is configured to compare the mirrored current to a feedback current based on operations of the receiver replica circuitry.

In some examples, an opto-emulator transmitter (e.g., the opto-emulator transmitter 102 in FIG. 1) includes: transmitter circuitry (e.g., the transmitter circuitry 112 in FIG. 1) having a first terminal (e.g., the first terminal 114 in FIG. 1), a second terminal (e.g., the second terminal 116 in FIG. 1), a third terminal (e.g., the third terminal 118 in FIG. 1), a fourth terminal (e.g., the fourth terminal 120 in FIG. 1), and a fifth terminal (e.g., the fifth terminal 122 in FIG. 1); and receiver replica circuitry (e.g., the receiver replica circuitry 126 in FIG. 1) having a first terminal (e.g., the first terminal 128 in FIG. 1), a second terminal (e.g., the second terminal 130 in FIG. 1), and a third terminal (e.g., the third terminal 132 in FIG. 1). The first terminal of the receiver replica circuitry is coupled to the third terminal of the transmitter circuitry. The second terminal of the receiver replica circuitry is coupled to the fourth terminal of the transmitter circuitry. The third terminal of the receiver replica circuitry is coupled to the fifth terminal of the transmitter circuitry. In such examples, the transmitter circuitry is configured to: receive a current at the first terminal of the transmitter circuitry; provide a transmit signal at the third and fourth terminals of the transmitter circuitry responsive to the current; receive a feedback signal from the receiver replica circuitry at the fifth terminal of the transmitter circuitry, the feedback signal responsive to the transmit signal; and provide an adjusted transmit signal at the third and fourth terminals of the transmitter circuitry responsive to the current and the feedback signal.

In some examples, the current is a first current, and the transmitter circuitry includes an oscillator circuit (e.g., the LC oscillator 238 in FIG. 2) and a current controller (e.g., the current controller 222 in FIG. 2). In such examples, the current controller is configured to: compare a second current based on the feedback signal (e.g., the current through the transistor M1) with the output current to the LC oscillator (e.g., the current through the transistor M13 and the current through the transistor M14); and adjust the second current to the oscillator circuit responsive to the comparison result.

In some examples, the receiver replica circuitry includes a differential rectifier (e.g., the differential rectifier circuit 258 in FIG. 2) and a transistor (e.g., the transistor M1 in FIG. 2). In such examples, the differential rectifier has a first terminal (e.g., the first terminal 260 in FIG. 2), a second terminal (e.g., the second terminal 262 in FIG. 2), and a third terminal (e.g., the third terminal 264 in FIG. 2). The transistor has a first terminal, a second terminal, and a control terminal. The third terminal of the differential rectifier is coupled to the control terminal of the transistor. The differential rectifier is configured to: receive the transmit signal at the first and second terminals of the differential rectifier; and provide a rectified signal at the third terminal of the differential rectifier responsive to the transmit signal.

In some examples, the opto-emulator transmitter includes an attenuator circuit (e.g., the attenuator circuit 248 in FIG. 2) between the transmitter circuit and the receiver replica circuit. In such examples, the attenuator circuit is configured to attenuate the transmit signal based on an isolation circuit attenuation factor (e.g., a 1/k scaling, where k is the isolation circuit attenuation factor).

In some examples, an opto-emulator circuit includes: an opto-emulator receiver (e.g., the opto-emulator receiver 150A in FIGS. 3 and 4); and an opto-emulator transmitter (e.g., the opto-emulator transmitter 102A in FIGS. 2 and 4). The opto-emulator receiver includes: a first rectifier circuit (e.g., the differential rectifier circuit 304 in FIG. 3) having a first terminal (e.g., the first terminal 306), a second terminal (e.g., the second terminal 308), and a third terminal (e.g., the fourth terminal 312); and a first transistor (e.g., the transistor M2 in FIGS. 3 and 4) having a first terminal, a second terminal, and a control terminal. The control terminal of the transistor is coupled to the third terminal of the rectifier circuit. The opto-emulator receiver includes: a current controller (e.g., the current controller 222 in FIG. 2, related circuitry in FIG. 5); an oscillator circuit (e.g., the LC oscillator in FIG. 2); a second rectifier circuit (e.g., the differential rectifier circuit 258 in FIG. 2); and a second transistor (e.g., the transistor M1 in FIG. 2). The current controller has a first terminal (e.g., the first terminal 224 in FIG. 2), a second terminal (e.g., the third terminal 228 in FIG. 2), and a third terminal (e.g., the fourth terminal 230 in FIG. 2). The oscillator circuit has a first terminal (e.g., the first terminal 240 in FIG. 2), a second terminal (e.g., the second terminal 242 in FIG. 2), and third terminal (e.g., the third terminal 244 in FIG. 2). The first terminal of the oscillator circuit is coupled to the second terminal of the current controller. The second rectifier circuit has a first terminal (e.g., the first terminal 260 in FIG. 2, a second terminal (e.g., the second terminal 262 in FIG. 2), and a third terminal (e.g., the third terminal 264 in FIG. 2). The first terminal of the second rectifier circuit is coupled to the second terminal of the oscillator circuit. The second terminal of the second rectifier circuit is coupled to the third terminal of the oscillator circuit. The second transistor has a first terminal, a second terminal, and a control terminal. The control terminal of the transistor is coupled to the third terminal of the second rectifier circuit.

In some examples, the opto-emulator includes isolation circuitry (e.g., the isolation circuitry 134 in FIG. 1, or the isolation circuitry 134A in FIG. 4) between the opto-emulator transmitter and the opto-emulator receiver. The isolation circuitry has a first terminal (e.g., the first terminal 136 in FIGS. 1 and 4), a second terminal (e.g., the second terminal 138 in FIGS. 1 and 4), a third terminal (e.g., the third terminal 140 in FIGS. 1 and 4), and a fourth terminal (e.g., the fourth terminal 142 in FIGS. 1 and 4). The first terminal of the isolation circuitry is coupled to the second terminal of the oscillator circuit. The second terminal of the isolation circuitry is coupled to the third terminal of the oscillator circuit. The third terminal of the isolation circuitry is coupled to the first terminal of the first rectifier circuit. The fourth terminal of the isolation circuitry is coupled to the second terminal of the first rectifier circuit, wherein the isolation circuitry includes a transformer (e.g., the transformer circuitry 406 in FIG. 4).

In some examples, the opto-emulator transmitter includes an attenuator circuit (e.g., the attenuator circuit 248 in FIGS. 2 and 4) having a first terminal (e.g., the first terminal 250 in FIG. 2), a second terminal (e.g., the second terminal 252 in FIG. 2), a third terminal (e.g., the third terminal 254 in FIG. 2), and a fourth terminal (e.g., the fourth terminal 256 in FIG. 2). The first terminal of the attenuator circuit is coupled to the second terminal of the oscillator circuit. The second terminal of the attenuator circuit is coupled to the third terminal of the oscillator circuit. The third terminal of the oscillator circuit is coupled to the first terminal of the rectifier circuit. The fourth terminal of the oscillator circuit coupled to the second terminal of the rectifier circuit. The attenuator circuit has an attenuation factor that matches attenuation of the isolation circuitry.

In some examples, each of the opto-emulator transmitter, the isolation circuitry, and the opto-emulator receiver are on a separate integrated circuit die. In some examples, the first rectifier circuit is a first differential rectifier circuit, the second rectifier circuit is a second differential rectifier circuit, the oscillator circuit is a differential oscillator circuit, the second rectifier circuit is a replica of the first rectifier circuit, and the second transistor is a replica of the first transistor. In some examples, the second rectifier circuit is configured to: receive a transmit signal from the oscillator circuit; and provide a feedback signal responsive to the transmit signal. In such examples, the current controller is configured to: compare a current based on the feedback signal (e.g., the current through the transistor M1) with a target current (e.g., the output current to the LC oscillator) to obtain a comparison result; and adjust current to the oscillator circuit responsive to the comparison result.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described examples, and other examples are possible, within the scope of the claims.

The invention claimed is:

1. An opto-emulator transmitter comprising:
- a current controller having a first terminal, a second terminal, and a third terminal;
- an oscillator circuit having a first terminal, a second terminal, and a third terminal, the first terminal of the oscillator circuit coupled to the second terminal of the current controller; and
- receiver replica circuitry having a first terminal, a second terminal, and a third terminal, the first terminal of the receiver replica circuitry coupled to the second terminal of the oscillator circuit, the second terminal of the receiver replica circuitry coupled to the third terminal of the oscillator circuit, and the third terminal of the receiver replica circuitry coupled to the third terminal of the current controller,
- wherein the receiver replica circuitry includes a transistor having a first terminal, a second terminal, and a control terminal, the first terminal of the transistor coupled to the third terminal of the receiver replica circuitry.

2. The opto-emulator transmitter of claim 1, wherein the transistor is configured to adjust a current transfer ratio (CTR) based on a feedback signal from the receiver replica circuitry.

3. The opto-emulator transmitter of claim 2, wherein the receiver replica circuitry includes a rectifier circuit having a first terminal, a second terminal, and a third terminal, the first terminal of the rectifier circuit coupled to the first terminal of the receiver replica circuitry, the second terminal of the rectifier circuit coupled to the second terminal of the receiver replica circuitry, the third terminal of the rectifier circuit coupled to the third terminal of the receiver replica circuitry, and the third terminal of the receiver replica circuitry coupled to the control terminal of the transistor.

4. The opto-emulator transmitter of claim 3, wherein the rectifier circuit is a differential rectifier circuit, and the oscillator circuit is a differential oscillator circuit.

5. The opto-emulator transmitter of claim 1, further comprising an attenuator circuit having a first terminal, a second terminal, a third terminal, and a fourth terminal, the first terminal of the attenuator circuit coupled to the second terminal of the oscillator circuit, the second terminal of the attenuator circuit coupled to the third terminal of the oscillator circuit, the third terminal of the attenuator circuit coupled to the first terminal of the receiver replica circuitry, and the fourth terminal of the attenuator circuit coupled to the second terminal of the receiver replica circuitry.

6. The opto-emulator transmitter of claim 1, further comprising a fuse, reverse protection circuitry, and electrostatic discharge (ESD) circuitry, the fuse having a first terminal and a second terminal, the reverse protection circuitry having a first terminal and a second terminal, the ESD circuitry having a first terminal and a second terminal, the second terminal of the fuse coupled to the first terminal of the reverse protection circuitry and to the first terminal of the ESD circuitry, the second terminal of the reverse protection circuitry coupled to the first terminal of the current controller.

7. The opto-emulator transmitter of claim 1, wherein the current controller includes reliability clamp circuitry and shunt bypass circuitry, the reliability clamp circuitry is configured to clamp voltage and current levels of the opto-emulator transmitter, and the shunt bypass circuitry is configured to regulate an output current to the oscillator circuit.

8. The opto-emulator transmitter of claim 7, wherein the current controller includes source follower circuitry, current mirror circuitry, and current comparator circuitry, the source follower circuitry is configured to set a gain level of the current controller, the current mirror circuitry is configured to mirror current of the shunt bypass circuitry to the current comparator circuitry, and the current comparator circuitry is configured to compare the mirrored current to a feedback current based on operations of the receiver replica circuitry.

9. The opto-emulator transmitter of claim 1, wherein the current controller has a fourth terminal, and the opto-emulator transmitter further comprises a diode emulator having a first terminal and a second terminal, the first terminal of the diode emulator coupled to the fourth terminal of the current controller.

10. An opto-emulator transmitter comprising:
- transmitter circuitry having a first terminal, a second terminal, a third terminal, a fourth terminal, and a fifth terminal; and
- receiver replica circuitry having a first terminal, a second terminal, and a third terminal, the first terminal of the receiver replica circuitry coupled to the third terminal of the transmitter circuitry, the second terminal of the receiver replica circuitry coupled to the fourth terminal of the transmitter circuitry, and the third terminal of the receiver replica circuitry coupled to the fifth terminal of the transmitter circuitry,
- wherein the transmitter circuitry is configured to:
  - receive a current at the first terminal of the transmitter circuitry;
  - provide a transmit signal at the third and fourth terminals of the transmitter circuitry responsive to the current;
  - receive a feedback signal from the receiver replica circuitry at the fifth terminal of the transmitter circuitry, the feedback signal responsive to the transmit signal; and
  - provide an adjusted transmit signal at the third and fourth terminals of the transmitter circuitry responsive to the current and the feedback signal.

11. The opto-emulator transmitter of claim 10, wherein the current is a first current, the transmitter circuitry includes an oscillator circuit and a current controller, and the current controller is configured to:
- compare a second current based on the feedback signal with a target current to obtain a comparison result; and
- adjust the second current to the oscillator circuit responsive to the comparison result.

12. The opto-emulator transmitter of claim 11, wherein the current is a first current, the transmitter circuitry includes an oscillator circuit and a current controller, and the current controller is configured to limit the first current based on a target voltage for the transmitter circuitry.

13. The opto-emulator transmitter of claim 10, wherein the receiver replica circuitry includes a differential rectifier and a transistor, the differential rectifier having a first terminal, a second terminal, and a third terminal, the transistor having a first terminal, a second terminal, and a control terminal, the third terminal of the differential rectifier coupled to the control terminal of the transistor, and the differential rectifier configured to:
- receive the transmit signal at the first and second terminals of the differential rectifier; and
- provide a rectified signal at the third terminal of the differential rectifier responsive to the transmit signal.

14. The opto-emulator transmitter of claim 10, further comprising an attenuator circuit between the transmitter circuit and the receiver replica circuit, the attenuator circuit configured to attenuate the transmit signal based on an isolation circuit attenuation factor.

15. An opto-emulator circuit comprising:
- an opto-emulator receiver that includes:
  - a first rectifier circuit having a first terminal, a second terminal, and a third terminal; and
  - a first transistor having a first terminal, a second terminal, and a control terminal, the control terminal of the transistor coupled to the third terminal of the rectifier circuit; and
- an opto-emulator transmitter that includes:
  - a current controller having a first terminal, a second terminal, and a third terminal;
  - an oscillator circuit having a first terminal, a second terminal, and third terminal, the first terminal of the oscillator circuit coupled to the second terminal of the current controller;
  - a second rectifier circuit having a first terminal, a second terminal, and a third terminal, the first terminal of the second rectifier circuit coupled to the second terminal of the oscillator circuit, and the second terminal of the second rectifier circuit coupled to the third terminal of the oscillator circuit; and
  - a second transistor having a first terminal, a second terminal, and a control terminal, the control terminal of the transistor coupled to the third terminal of the second rectifier circuit.

16. The opto-emulator of claim 15, further comprising isolation circuitry between the opto-emulator transmitter and the opto-emulator receiver, the isolation circuitry having a first terminal, a second terminal, a third terminal, and a fourth terminal, the first terminal of the isolation circuitry coupled to the second terminal of the oscillator circuit, the second terminal of the isolation circuitry coupled to the third terminal of the oscillator circuit, the third terminal of the isolation circuitry coupled to the first terminal of the first rectifier circuit, the fourth terminal of the isolation circuitry coupled to the second terminal of the first rectifier circuit, wherein the isolation circuitry includes a transformer.

17. The opto-emulator circuit of claim 16, wherein the opto-emulator transmitter includes an attenuator circuit having a first terminal, a second terminal, a third terminal, and a fourth terminal, the first terminal of the attenuator circuit coupled to the second terminal of the oscillator circuit, the second terminal of the attenuator circuit coupled to the third terminal of the oscillator circuit, the third terminal of the oscillator circuit coupled to the first terminal of the rectifier circuit, the fourth terminal of the oscillator circuit coupled to the second terminal of the rectifier circuit, and the attenuator circuit having an attenuation factor that matches attenuation of the isolation circuitry.

18. The opto-emulator circuit of claim 16, wherein each of the opto-emulator transmitter, the isolation circuitry, and the opto-emulator receiver are on a separate integrated circuit die.

19. The opto-emulator circuit of claim 15, wherein the first rectifier circuit is a first differential rectifier circuit, the second rectifier circuit is a second differential rectifier circuit, the oscillator circuit is a differential oscillator circuit, the second rectifier circuit is a replica of the first rectifier circuit, and the second transistor is a replica of the first transistor.

20. The opto-emulator circuit of claim 15, wherein the second rectifier circuit is configured to:

receive a transmit signal from the oscillator circuit; and provide a feedback signal responsive to the transmit signal, and the current controller is configured to:

compare a current based on the feedback signal with a target current to obtain a comparison result; and adjust current to the oscillator circuit responsive to the comparison result.

* * * * *